(12) United States Patent
Stockinger et al.

(10) Patent No.: US 9,202,808 B2
(45) Date of Patent: Dec. 1, 2015

(54) INTEGRATED CIRCUIT ELECTRICAL PROTECTION DEVICE

(71) Applicants: Michael A. Stockinger, Austin, TX (US); Wenzhong Zhang, Tianjin (CN); Xu Zhang, Beijing (CN)

(72) Inventors: Michael A. Stockinger, Austin, TX (US); Wenzhong Zhang, Tianjin (CN); Xu Zhang, Beijing (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 1 day.

(21) Appl. No.: 14/231,849

(22) Filed: Apr. 1, 2014

(65) Prior Publication Data

US 2015/0279836 A1 Oct. 1, 2015

(30) Foreign Application Priority Data

Mar. 27, 2014 (CN) .......................... 2014 1 0117590

(51) Int. Cl.
*H01L 27/02* (2006.01)
(52) U.S. Cl.
CPC .................................. *H01L 27/0285* (2013.01)
(58) Field of Classification Search
CPC .................................................. H01L 27/0292

USPC .................................................. 257/355–363
See application file for complete search history.

(56) References Cited

U.S. PATENT DOCUMENTS

| 7,002,220 | B1 * | 2/2006 | Jin et al. ......................... 257/358 |
| 7,005,708 | B2 | 2/2006 | Mergens et al. |
| 7,098,510 | B2 * | 8/2006 | Kodama et al. ............... 257/355 |
| 7,170,726 | B2 | 1/2007 | Ker et al. |
| 9,076,656 | B2 * | 7/2015 | Etherton et al. ....................... 1/1 |

OTHER PUBLICATIONS

Ker, M. et al.; "Self-Substrate-Triggered Technique to Enhance Turn-on Uniformity of Multi-Finger ESD Protection Devices"; 2005 VLSI-TSA International Symposium on VLSI Technology; Apr. 25-27, 2005; pp. 17-18.
Huh, Y. et al., "The Effects of Substrate Coupling on Triggering Uniformity and ESD Failure Threshold of Fully Silicided NMOS Transistors," IEEE 2002 Symposium on VLSI Technology Digest of Technical Papers; Jun. 11-13, 2002; ISBN: 0-7803-7312-X; pp. 220-221.

* cited by examiner

*Primary Examiner* — Cuong Q Nguyen

(57) ABSTRACT

An integrated circuit electrical protection device is disclosed that includes a semiconductor substrate and a plurality of transistor fingers partitioned into a plurality of segments. The segments are distinguished from one another by well-ties spaced apart from each other within a source/drain region that is shared by adjacent segments.

20 Claims, 8 Drawing Sheets

US 9,202,808 B2

INTEGRATED CIRCUIT ELECTRICAL PROTECTION DEVICE

RELATED APPLICATION(S)

The present application claims priority to CN Patent Application No. 201410117590.6, entitled "Integrated Circuit Electrical Protection Device," filed on Mar. 27, 2014, the entirety of which is herein incorporated by reference.

BACKGROUND

1. Field

This disclosure relates generally to electrical protection, and more particularly to electrical protection for an integrated circuit.

2. Related Art

An integrated circuit (IC) die may be subject to an overstress event such as a high-voltage event that can be destructive to the IC. An electrostatic discharge (ESD) event is such an overstress event that can occur during a manufacturing process, assembly, testing, or in the system application. Some on-chip ESD protection networks use an active MOSFET (Metal Oxide Semiconductor Field-Effect Transistor) rail clamp protection scheme with large ESD diodes between features being protected from ESD, such as input/output (I/O) pads, and the power supply rails. This approach has been effective but the currents involved can be large enough so that the MOSFET must accordingly be large, which is accomplished by using many MOSFET transistors in parallel, referred to as fingers. The number of MOSFET transistor fingers used to implement a MOSFET at an ESD protection device can be large enough so that the transistor fingers are divided into segments that are separated from one another by well-ties to ensure compliance with design rules that specify a maximum distance between any point of a transistor source/drain region and a well-tie such as to improve the intrinsic latch-up robustness of the MOSFET as well as its latch-up robustness with respect to any other nearby integrated circuit components.

FIG. 1 illustrates an overhead view of a portion 9 of a layout of an integrated circuit die having an ESD protection circuit comprising a MOSFET implemented using a plurality of MOSFET fingers 41 connected in parallel. The illustrated portion 9 includes a well-tie structure that includes a well-tie 21 and an adjacent dielectric region 11. The well-tie 21 includes a ring portion 90 (the well-tie ring) having an outer periphery 20 and a plurality of dissecting portions 22-25 that extend across the interior of the well-tie ring 90 to divide the ESD protection circuit into a plurality of segments 31-35. As specifically shown in segments 33 and 34, each one of the segments 31-35 includes a portion of the plurality of MOSFET transistors making up the ESD protection circuit. Each segments' set of transistors has corresponding source, drain, and channel regions within an active region 50 that is separated from the well-tie 21 by the dielectric region 11, which can be a Shallow Trench Isolation region (STI region).

One of the mechanisms that is useful in such a MOSFET configuration during an ESD event uses a bipolar device that is inherently present in the layout of the MOSFET, wherein such a bipolar device is a bipolar junction transistor (BJT) that can be turned on by a mechanism commonly referenced as "snapback" to provide additional protection during an ESD event. A schematic representation of such a bipolar device 60 is illustrated in FIG. 2, which illustrates a cross-sectional layout view along the lateral cross-section indicator line 2 of FIG. 1. In particular, the base of the inherent BJT 60, which is an NPN transistor, corresponds to the body of the MOSFET fingers, the collector of the BJT 60 corresponds to the drain regions of the MOSFET fingers, and the emitter of the BJT 60 corresponds to the source regions of the MOSFET fingers.

During an overstress event, snapback occurs due to a large voltage between the drain and the source of a MOSFET transistor of the ESD circuit that causes a change in a potential of the transistor's body region that causes the source-body junction diode of the MOSFET to turn on. The potential change in the body region can, for example, be due to drain-body junction leakage current during an ESD event that causes the body voltage to rise due to a voltage drop along a resistive path from the body region of the MOSFET near the MOSFETs source to a body tie. Once the source-body diode is turned on, current starts flowing between the drain and the source due to the inherent BJT device with the drain as the collector. The large collector current can cause impact ionization current that adds to the already flowing drain-body junction leakage current, further turning on the bipolar device. This can ultimately result in snapback, which is a characterized by a significant increase in the current that is provided between the source and drain and which typically causes the drain-source voltage to drop or "snap back" in a corresponding I-V chart. Much of the current flowing from the drain to the source is flowing down in the well region that is below the MOSFET channel. This snapback event can be relied upon to provide protection by sinking current when there is an ESD event, so long as the amount of snapback current at each segments' inherent bipolar device is low enough to be non-destructive to the MOSFET features during its duration.

However, the segment that first enters the snapback regime before other segments can be physically damaged if it has to sink the ESD current for a sufficiently long period of time before its ESD current load is reduced by other segments of the ESD protection circuit experiencing snapback. Furthermore, when the first segment enters the snapback regime, the drain-source voltage of the entire MOSFET typically drops due to the sudden reduction in the effective on-resistance of the first segment. This makes it less likely for other segments to enter the snapback regime as well because snapback is initiated by a large drain-source voltage. It is therefore desirable to increase the number of MOSFET segments that enter the snapback regime in order to maximize the failure current level of the ESD protection structure. Various proposals have been forwarded to facilitate more readily placing a greater number of segments of an ESD circuit into snapback during an ESD event, based on one of the segments which enters snapback first. For example, according to one proposal, a well-tie near a particular segment of an N-channel MOSFET is connected to one or more dedicated source regions of another segment. These dedicated source regions of the other segment are not connected to ground. Therefore, their voltage level gets elevated when the second segment enters bipolar conduction (snapback) due to the parasitic lateral BJT providing a current path from drain regions to the dedicated source regions. This may provide a feedback path that actively drives the well region at the well-tie in the particular segment to a higher voltage to facilitate snapback at the particular segment. This, and other techniques, however, add additional complexity to the ESD circuitry, and can reduce the number of transistor fingers that would otherwise be available to sink current during an ESD event. Furthermore, such well ties are not connected to a fixed voltage terminal (e.g. ground) and do therefore not aid in improving the latch-up robustness of the protection structure. Accordingly there is a need to provide further improvement in achieving snapback in inherent BJTs to provide protection during overstress events.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

An overstress protection device for an integrated circuit die is disclosed that has a field-effect transistor (FET) made up of many transistor fingers connected in parallel that are laid out in a plurality of segments, each having a plurality of transistor fingers. The segments are separated from one another by an intervening well-tie region that includes well-ties within a source/drain region shared by two transistor fingers. The well-ties can be well-tie islands surrounded by the shared source/drain region, or well-ties that extend into the shared source/drain region from a well-tie ring. The well-ties are connected to a fixed voltage reference terminal that provides a fixed voltage, such as a ground, during normal operation. During overstress operation, such as during an ESD event or other high-voltage event, one of the transistor segments can experience snapback before another segment. The layout of the overstress protection device is such that current from the segment initially experiencing snapback flows more readily to an adjacent segment, not yet in snapback, along a path between the well-tie structures of a well-tie region than it does along a path that passes under the well-tie structures. By more readily allowing current to flow from a segment initially experiencing snapback to an adjacent segment not yet in snapback, snapback is also facilitated at the adjacent segment. An overstress protection devices that requires all of the inter-segment current to pass under a well-tie structure (the well-tie and its surrounding dielectric) may only experience snapback in the segment initially going into snapback and not in adjacent segments, which may cause non-uniform current conduction in the protection device and thus reduced protection from overstress conditions. By more readily allowing the current to flow from segment to segment, without implementing a feedback path from the segment region of a transistor to a well-tie, protection from overstress conditions is established.

Figure 3:
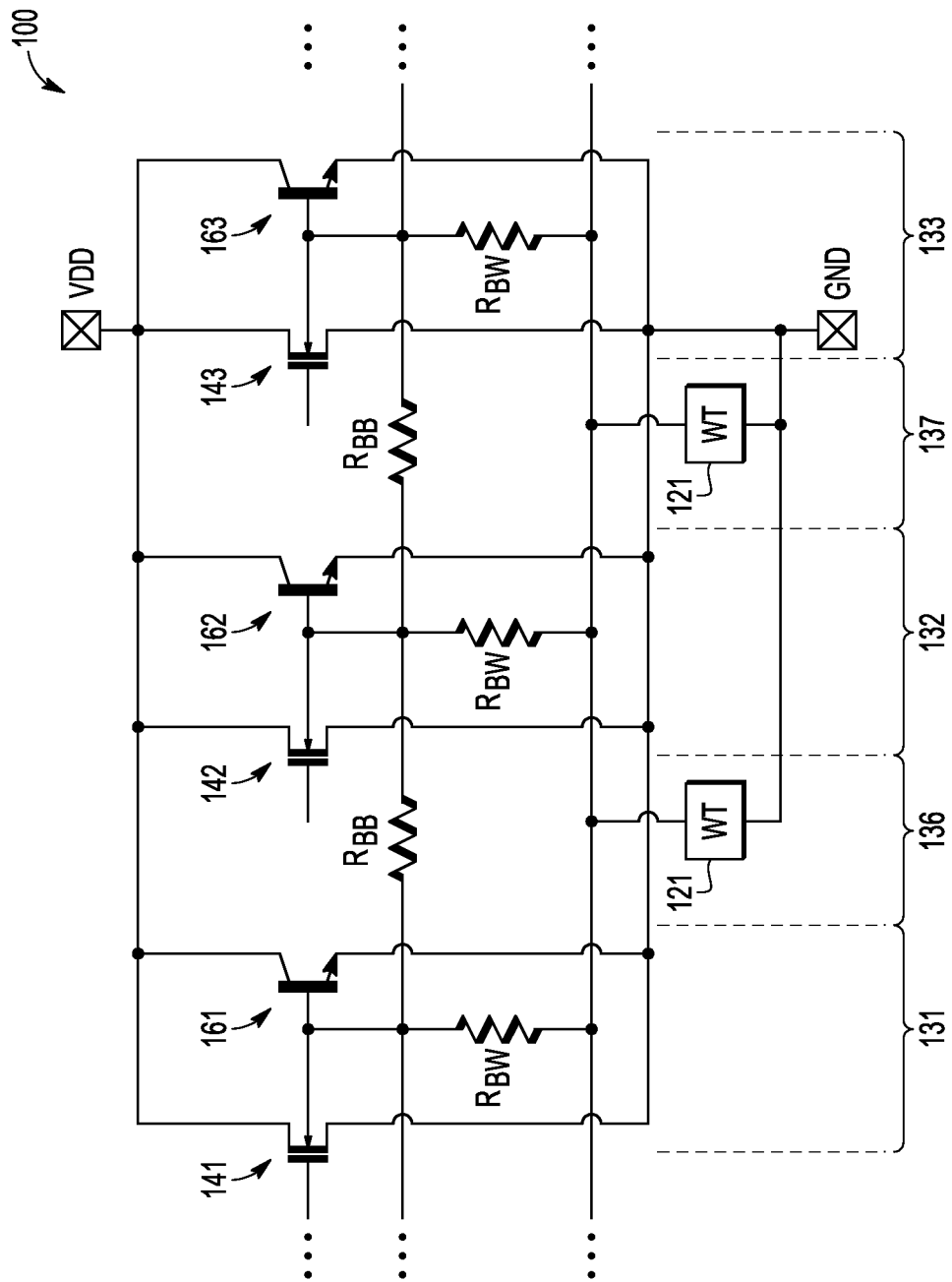
FIG. 3 is a circuit diagram of an overstress protection circuit according to a particular embodiment.

FIG. 3 is a circuit diagram that illustrates an overstress protection circuit 100 according to an embodiment of the present disclosure. In particular, the overstress protection circuit comprises an N-channel MOSFET transistor, and corresponding inherent BJT, that is represented by multiple MOSFET transistors 141-143 connected in parallel. Each one of the transistors 141-143 can include a plurality of transistor fingers that are separated from the transistor fingers of an adjacent transistor by a well-tie region. Thus, each one of the transistors 141-143 is disposed at a particular portion of an overstress protection circuit, referred to as a segment that is represented by reference numerals 131-133. For example, a well-tie region 136 is between transistors 141 and 142, and a well-tie region 137 is between transistors 142 and 143. Each of well-tie regions 136-137 includes a corresponding well-tie 121 (WT 121) that is connected to terminal GND, as will be further discussed herein.

Segment 131, also referred to as transistor segment 131, includes MOSFET 141 and a corresponding inherent BJT 161. The collector, emitter, and base of BJT 161 correspond to the drain, source, and body of transistor 141, respectively. Transistor segment 132, also referred to as transistor segment 132, includes MOSFET 142 and a corresponding inherent BJT 162. The collector, emitter, and base of BJT 162 correspond to the drain, source, and body of transistor 142, respectively. Transistor segment 133, also referred to as transistor segment 133, includes MOSFET 143 and a corresponding inherent BJT 163. The collector, emitter, and base of BJT 163 correspond to the drain, source, and body of transistor 143, respectively.

The drain/collector of each segments' MOSFET/BJT pair is connected to a terminal labeled VDD that is protected by the overstress protection circuit 100. Terminal VDD can be a conductive node at which a fixed voltage reference is provided, such as VDD. The source/emitter of each segments' MOSFET/BJT pair is connected to a terminal labeled GND at which a fixed voltage, such as ground, is provided during operation. The fixed voltages are provided to the terminals GND and VDD during normal operation, and can be generated by a voltage regulator disposed at the same integrated circuit die as the overstress protection circuit, or can be provided from a voltage source external to the integrated circuit die. The gate of each MOSFET 141-143 can be connected (not shown) to a terminal that provides a fixed voltage, such as terminal GND, or to an output terminal of a driver circuit that operates to turn on the MOSFETs 141-143 during an overstress event. In another embodiment, there can be an intervening resistor between the gate and source of each transistor.

The body-to-well-tie resistance of each segment is illustrated as resistor Rbw, and is the resistance between the body of each segments' MOSFET and the well-ties 121 at which a fixed voltage is provided. In the illustrated embodiment, the well-ties 121 are connected to terminal GND. The body-to-body resistance from the body of one segment's MOSFET to the body of an adjacent segment's MOSFET is illustrated as resistor Rbb.

In the absence of a high-voltage event, the transistors of FIG. 3 remain non-conductive. However, in response to a large voltage between the drain and source of the MOSFET transistor, avalanche current from a drain-body junction of one of the transistor segments can introduce a current to the well region that causes a voltage drop along the body-to-well-tie resistive path (Rbw). As discussed above, this voltage drop can trigger a high-current snapback resulting in the BJT turning on. With respect to the protection device of FIG. 3, the resistance Rbb is lower than in other protection devices having continuous well-ties connected to fixed voltage terminals that extend across the well-tie ring, without paths between transistor segments. This lower Rbb more readily facilitates the flow of snapback current from the body of a transistor segment initially experiencing snapback to the body of an adjacent transistor segment not yet in snapback. This results in elevating the body voltage of the adjacent transistor segments, thus facilitating snapback of the adjacent segments. A particular layout of the voltage protection device 100 will be better understood with reference to FIGS. 4-7

Figure 4:
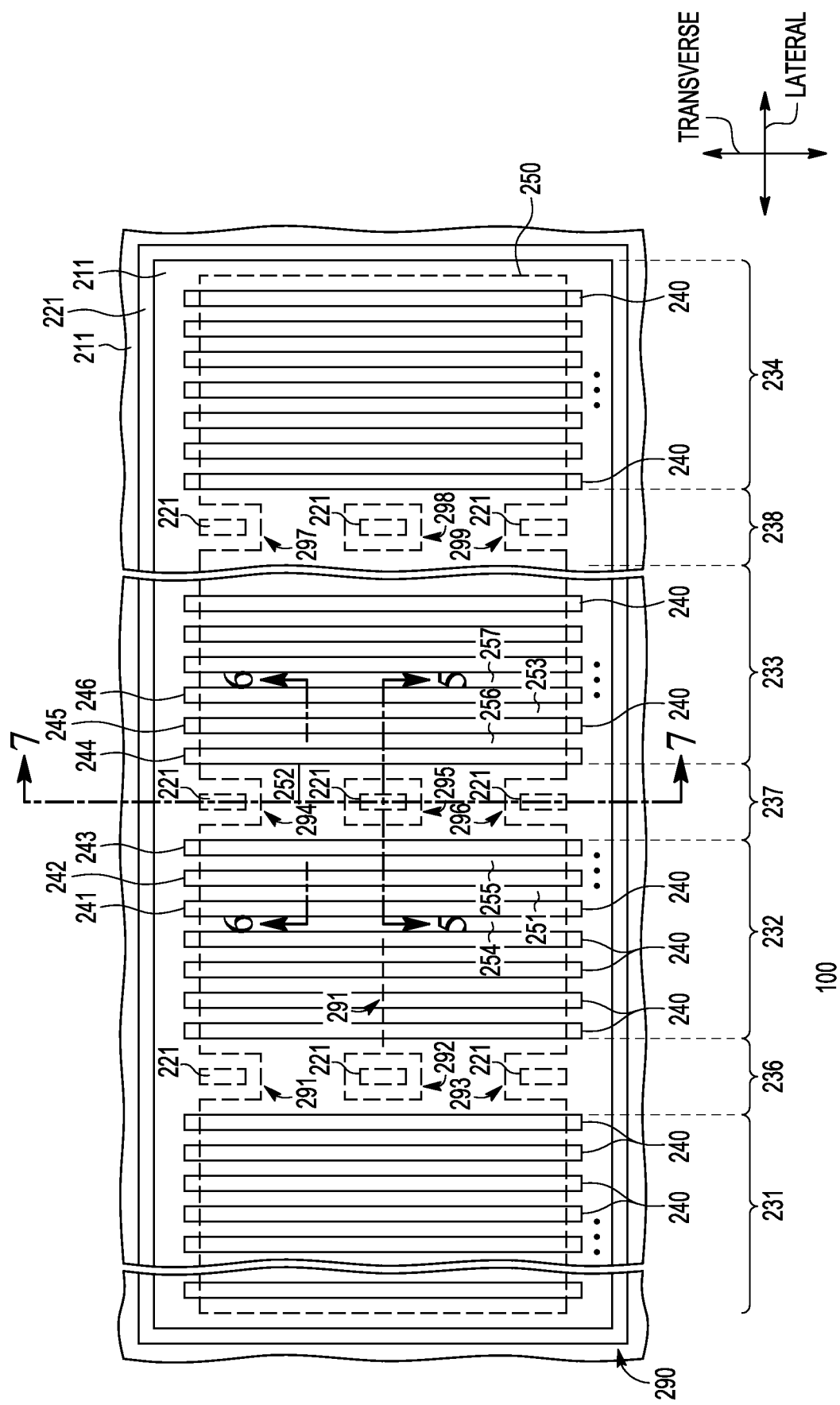
FIG. 4 is a top view of a layout of the overstress protection circuitry of FIG. 3, according to a particular embodiment.

FIG. 4 illustrates an embodiment of a layout of the overstress protection device 100 of FIG. 3 having well-ties 221 and a plurality of MOSFET transistor fingers 240 arranged in a plurality of segments 231-234. Segments 231-233 correspond to segments 131-133 of FIG. 3. Well-ties 221 include a well-tie ring 290 and a plurality of separate well-tie islands at well-tie regions 236-238 that are disposed within the well-tie ring. The term "well-tie island" as used herein is intended to refer to a well-tie between transistor segments with the well-tie physically separated from the well-tie ring. For purposes of discussion, it is presumed that the well-tie of a well-tie island is a region of p-doped silicon, and the dielectric surrounding the well-tie island is presumed to be an STI region 211.

Each one of the plurality of MOSFET transistor fingers 240 includes a transistor gate and adjacent source/drain regions formed within corresponding portions of active regions 250, wherein, with the exception of the well-tie islands 221, the region of FIG. 4 between active regions 250 and well-tie ring 290 is a portion of the STI region 211. As used herein, each one of the plurality of MOSFET transistor fingers 240 can be referred to as a MOSFET transistor finger, a MOSFET finger, a transistor finger, a finger, and variations thereof, to indicate it is one of a plurality of transistor fingers connected in parallel to make up a larger transistor. Transistor fingers 241-246 are specifically identified members of the plurality of MOSFET fingers 240. MOSFET finger 241 shares a source/drain region 251 with MOSFET finger 242. MOSFET finger 242 shares a source/drain region 255 with MOSFET finger 243. MOSFET finger 243 shares a source/drain region 252 with MOSFET finger 244, MOSFET finger 244 shares a source/drain region 256 with MOSFET finger 245, and MOSFET finger 245 shares a source/drain region 253 with MOSFET finger 246. It will be appreciated that term source/drain is intended to generically refer to both source and drain regions. As will be illustrated at FIG. 5, according to an embodiment source/drain regions 254-257 are presumed to be source regions connected to terminal GND, and source/drain regions 251-253 are presumed to be drain regions connected to terminal VDD.

The plurality of MOSFET fingers 240 are partitioned into sets that are disposed at segments 231-234. Each one of the segments 231-234 is distinguished from an adjacent segment by a well-tie region 236-238 that includes one or more well-ties. As illustrated, segment 232 is distinguished from segment 231 by well-tie region 236 which includes well-tie structures 291-293, each of which includes a corresponding well-tie island 221. Segment 232 is distinguished from segment 233 by well-tie region 237 which includes well-tie structures 294-296, each of which includes a corresponding well-tie island 221. Segment 233 is distinguished from segment 234 by well-tie region 238, which includes well-tie structures 297-299, each of which includes a corresponding well-tie island 221. The MOSFET formed by the MOSFET fingers within a segment is referred to herein as a MOSFET transistor segment, or a MOSFET segment. Ideally, each of the MOSFET transistor segments operates simultaneously as a common MOSFET transistor of a high-voltage protection circuit as they are connected in parallel.

The number of well-tie islands at a well-tie region can vary from that illustrated. For example, each well-tie region between segments can include more or fewer well-tie islands than that illustrated. When well-tie islands are present, there can be an even or odd number of well-tie islands. A well-tie island can be disposed at a center location of a well-tie region in a transverse direction. The term "transverse direction" as used herein is intended to mean the direction defined by the edge of a gate of a MOSFET transistor along its width, wherein it will be understood that width of the MOSFET transistor fingers illustrated at FIG. 4 is significantly longer than length of the fingers. Therefore, the center location of a well-tie region in a transverse direction is located halfway between the upper-most location of the source/drain region 252 and a lower-most portion of the source/drain region 252, and is indicated by the line 291. Thus, the well-tie islands 292, 295, and 298 are each disposed at the center location of their respective well-tie regions 236-238. The total number of transistor segments in a high-voltage protection device can be an odd or even number. By way of example, it is presumed that the device illustrated FIG. 5 includes an odd number of segments, and that segment 233 is the center segment of the odd number of segments. Alternatively, segment 233 could represent a non-center segment of a device having either an odd or even number of segments. FIG. 4 illustrates cross-sectional indicators having reference numbers 5-7 that correspond to FIGS. 5-7, respectively.

Figure 5:
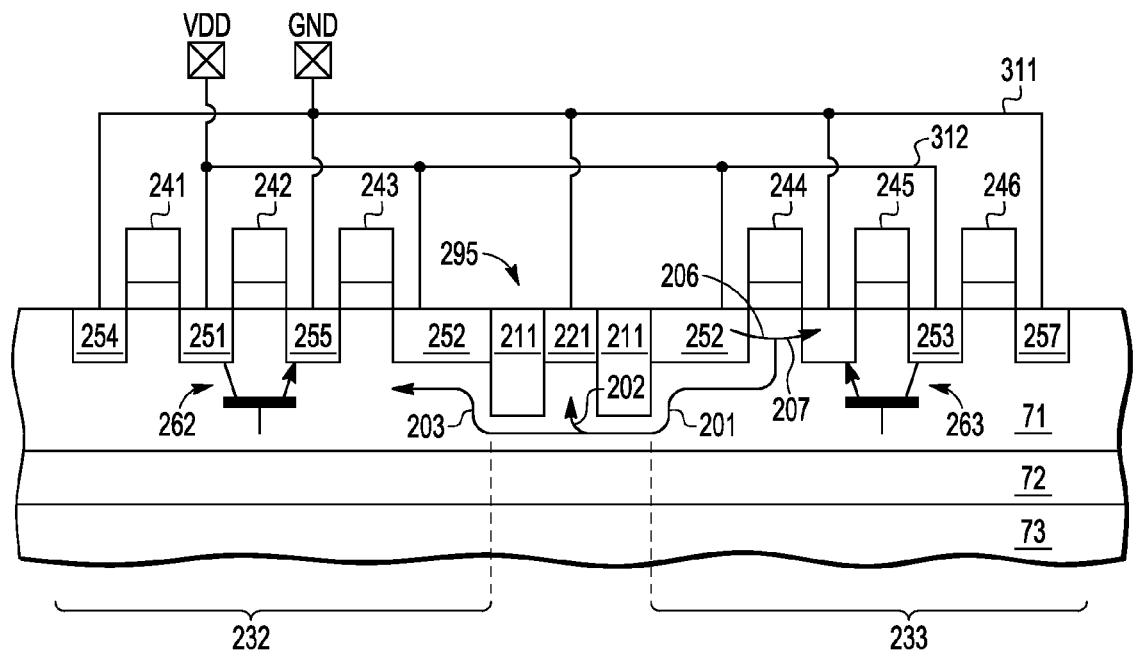
FIG. 5 is a cross section view of the layout of FIG. 4, according to a particular embodiment.

FIG. 5 illustrates a cross-sectional layout view along the lateral cross-section indicator line 5 of FIG. 4, and a circuit representation of various other features. As used herein, the term "lateral" is intended to refer to the direction orthogonal to the transverse direction, described above, that is also the direction of current flow through channel regions of the MOSFETs 240 when turned-on during normal operation (e.g., not during a high-voltage event).

The plurality of transistors 240 (FIG. 4), each include a gate stack overlying a channel region, and source/drain regions abutting the channel region. (Note that only transistors 241-246 of the plurality of transistors 240 are illustrated.) Therefore, each of the source/drain regions 251-257 of transistors 241-246, specifically illustrated at FIG. 5, is shared by abutting transistors. A conductive control gate is also illustrated as overlying a gate dielectric for each of transistors 241-246. For purposes of discussion, the source/drain regions 251-257 are presumed to be N-doped semiconductor regions residing in a P-type well 71 that correspond to channel and body regions of the MOSFETs 241-246.

Well-tie structure 295 is an island structure disposed between a portion of drain 252 that abuts the gate of transistor 244 and a portion of the drain 252 that abuts the gate of transistor 243. Thus, well-tie structures, and their corresponding well-ties, are disposed in a lateral direction between the gate of a leftmost transistor finger of one segment, such as segment 233, and the gate of a rightmost transistor finger of another segment, such as segment 232. Well-tie island 221 of well-tie island structure 295 is connected to terminal GND via the interconnect 311 to complete a well-tie connection to the well region 71.

Each of the source/drain regions 251-257 is connected to one of either the VDD terminal via an interconnect 312, or to the GND terminal via an interconnect 311. In particular, source/drain regions 251-253 are drain regions connected to the VDD terminal, and, therefore are also collector portions of the protective device's BJTs, as illustrated by the circuit representation of BJTs 262 and 263. It will be appreciated that within each segment there are a plurality of BJT transistors that correspond to the plurality of FETs of the segment, and that for purposes of discussion BJTs 262 and 263 can be presumed to represent each FET of their respective segments. Source/drain regions 254-257 are source regions connected to the GND terminal via interconnect 311, and therefore are also emitter portions of the protective device's BJTs, as illustrated by BJTs 262 and 263.

The P-type well 71, which constitutes the body of the transistors 241-246, overlies a layer 72 that can be an oxide layer, N-doped layer, or other appropriate layer. In some embodiments layer 72 may not be present. Layer 72 overlies a substrate 73, which can be a P-doped silicon substrate, or other appropriate layer that provides structural support for layers 71 and 72. The well-tie 221 is an interface region between the interconnect 311 of the device and the P-doped well region 71. According to an embodiment, the well-tie 221 is a P-doped silicon region typically having a higher doping concentration than that of the well 71, which is of the same conductivity type, i.e., is P-doped. It will be appreciated, that the well-tie can also include additional features, such as a silicide region (not illustrated). Line 206 of FIG. 5 represents current from the drain region 252 that is part of MOSFET finger 244 during a snapback event originating from segment 233. Line 207 of FIG. 5 represents the snapback current that flows from drain region 252 to source 256 during snapback. Line 201 of FIG. 5 represents a current path (201) from segment 233 to segment 232. The current along path 201 can be generated during snapback of the transistor of segment 233, and flows from drain region 252 to well region 71, and then under the well-tie island 295, via well region 71, before reaching segment 232. A portion 202 of the current 201 is illustrated as flowing towards the well-tie 221 because the well-tie 221 is at a low-voltage bias potential, leaving only a portion 203 of the current 201 to flow to the body regions of the adjacent segments to elevate the body potentials of the MOSFET transistor fingers in the adjacent segment during snapback of segment 233.

Figure 6:
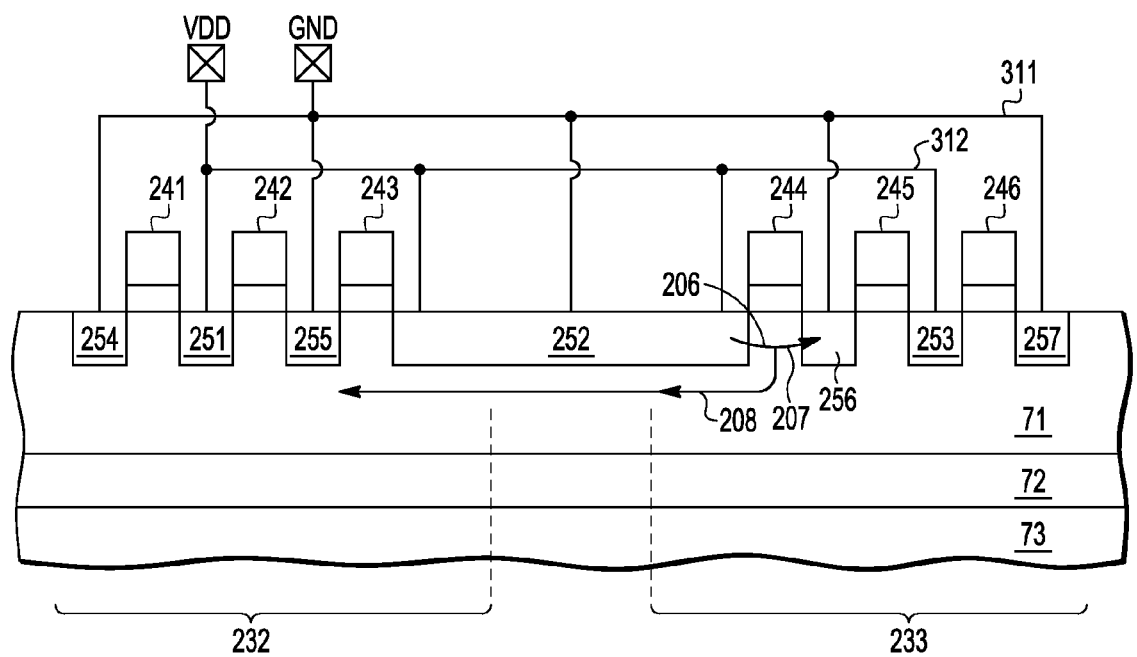
FIG. 6 is a cross section view of the layout of FIG. 4, according to a particular embodiment.

FIG. 6 illustrates a cross-sectional layout view along the lateral cross-section indicator line 6 of FIG. 4. The view of FIG. 6 is similar to the view of FIG. 5, except that the view of FIG. 6 does not intersect a well-tie. Instead, at the view of FIG. 6 the shared source/drain region 252 is continuous between the gate of transistor 243 and the gate of transistor 244. Thus, it will be appreciated that the well-tie island 221 of well-tie structure 295 is surrounded by the shared drain region 252, and that well-tie islands 221 of well-tie structures 294 and 296 (FIG. 4) are not surrounded by shared source/drain region 252, but are between portions of source/drain region 252. Lines 206 and 207 of FIG. 6 represent the current from the drain region 252 and the snapback current that flows to source 256, respectively, as described above. Line 208 represents a current path from segment 233 to segment 232. The current along path 208 can be generated during snapback of the transistor of segment 233, and flows from the drain region 252 to the well region 71 of segment 232. Because the drain region 252 is shared by both segments 232 and 233, there is a current path to segment 232 through the well region along a path underlying the shared source/drain region, and therefore does not cross under a well-tie and its surrounding dielectric. Thus, during snapback experienced in segment 233, a portion of snapback current can preferentially flow from segment 233 to segment 232 along path 208, as opposed to under a well-tie and its surrounding dielectric. While other MOSFET fingers of segment 233 may also experience snapback of their parasitic BJTs and therefore contribute to the current indicated by line 208, only the current originating from MOSFET finger 244 is shown in FIG. 6 for illustration purpose.

This preferential flow is because the resistance of path 208 can be lower than the resistance along paths 201 and 203 of FIG. 5 due at least partially to path 208 being a more direct path from segment 233 to segment 232 by virtue of being closer to the silicon surface, and by virtue of being within a highly doped region which can be less resistive than a path deeper in the well region. Path 208 may also have a deeper region of the well available for current flow, as measured between drain region 252 and layer 72, which typically provides a less resistive path than the shallower region between STI regions 211 and layer 72 for paths 201 and 203. Furthermore, a substantial portion of the current along path 201 in FIG. 5 may flow to the well-tie 221, as indicated by path 202, and only a smaller portion may flow into segment 232, as indicated by path 203. Therefore, snapback current originating in segment 233 and flowing along path 201 (FIG. 5) does not contribute to raising the voltage of adjacent segment 232's body region as much as snapback current flowing along path 208 (FIG. 6). As a result of the lower resistance path of FIG. 6 and of not losing some of the snapback current to a well tie along the path, lateral current flow occurs more readily to segment 232 from segment 233 between the well tie islands to elevate the voltage of the adjacent segment's body region more easily than does in the protection circuit of FIG. 1, which requires the entire current to pass under a continuous well-tie. As a result, transistor segments adjacent to the transistor segment initially experiencing snapback will themselves enter snapback more readily than with the prior art, thus reducing the likelihood of the initial snapback segment experiencing physical damage. However, the well tie islands 221 of well-tie structures 294-296 still guarantee that a design rule requiring a specified maximum spacing between any source/drain region and a well tie not to be exceeded can still be met on large multi-finger protection structures, similar to the protection circuit of FIG. 1. This ensures the latch-up robustness of the protection structure according to this invention.

Figure 7:
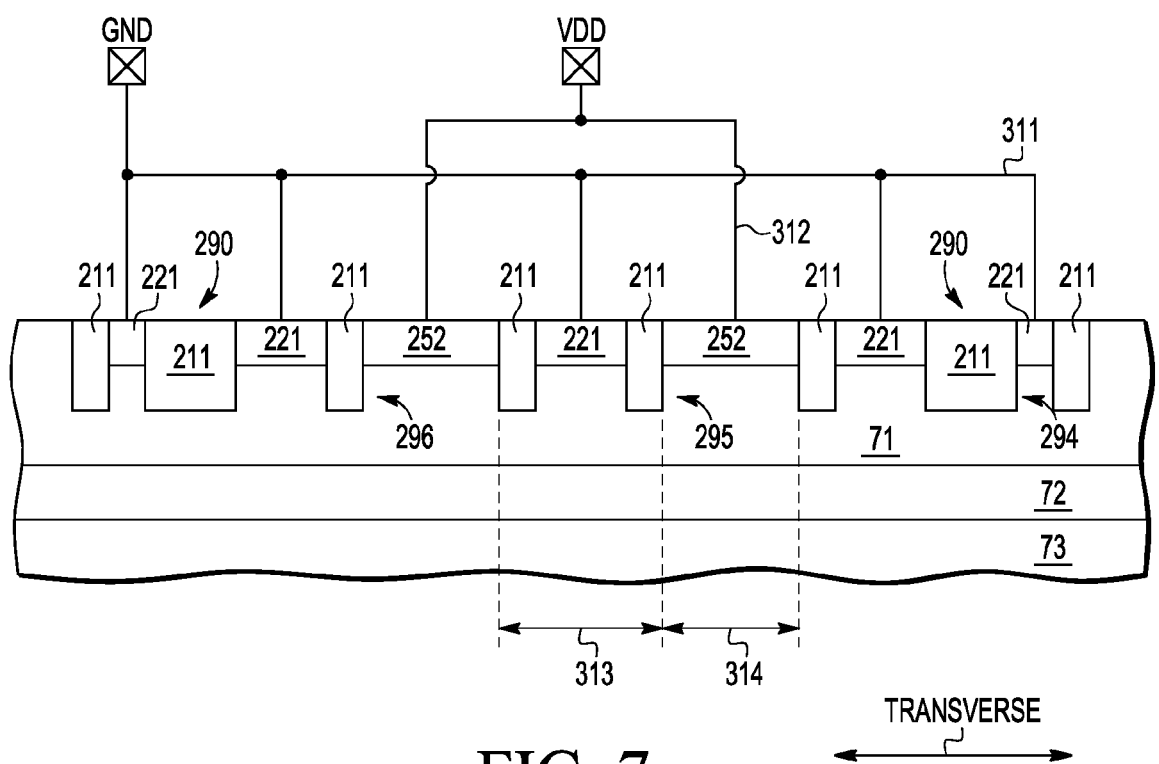
FIG. 7 is a cross section view of the layout of FIG. 4, according to a particular embodiment.

FIG. 7 illustrates a cross-sectional layout view along the transverse cross-section indicator line 7 of FIG. 4, and a circuit representation of various other features. Specifically illustrated are cross-sectional portions of the well-tie islands of structures 294-296, the well-tie ring 290, shared drain region 252, and circuit representations of interconnects 311, 312, and terminals VDD and GND. Note that by virtue of the well-tie island structure 295 being surrounded by the shared source/drain region 252, it is disposed between two portions of the shared source/drain region 252 in the transverse direction (FIG. 7) as well as in the lateral direction (FIG. 5). Well-tie island structures 294 and 296, however, are not disposed between portions of the shared source/drain region in the transverse direction (FIG. 7), but are disposed between portions of the shared source/drain region in the lateral direction (FIG. 5). In other embodiments, the well-tie island structures 294 and 296 can be positioned so that they too are surrounded by drain region 252. According to an embodiment, the transverse dimension 314 of the drain region between well-tie island structures, which is the shortest distance between the structures, is two or more times greater than the transverse dimension 313 of well-tie island structures. In other embodiments, the ratio of the transverse dimension of the drain region between well-tie island structures to the transverse dimension of the well-tie island structures can be 1:1, greater than 1:1, greater than 2:1, or less than 1:1. In other embodiments, the ratio can be any number suitable for improving the propagation of snapback current between adjacent segments while maintaining enough effective well tie area between segments for maintaining latch-up robustness of the protection structure.

Figure 1:
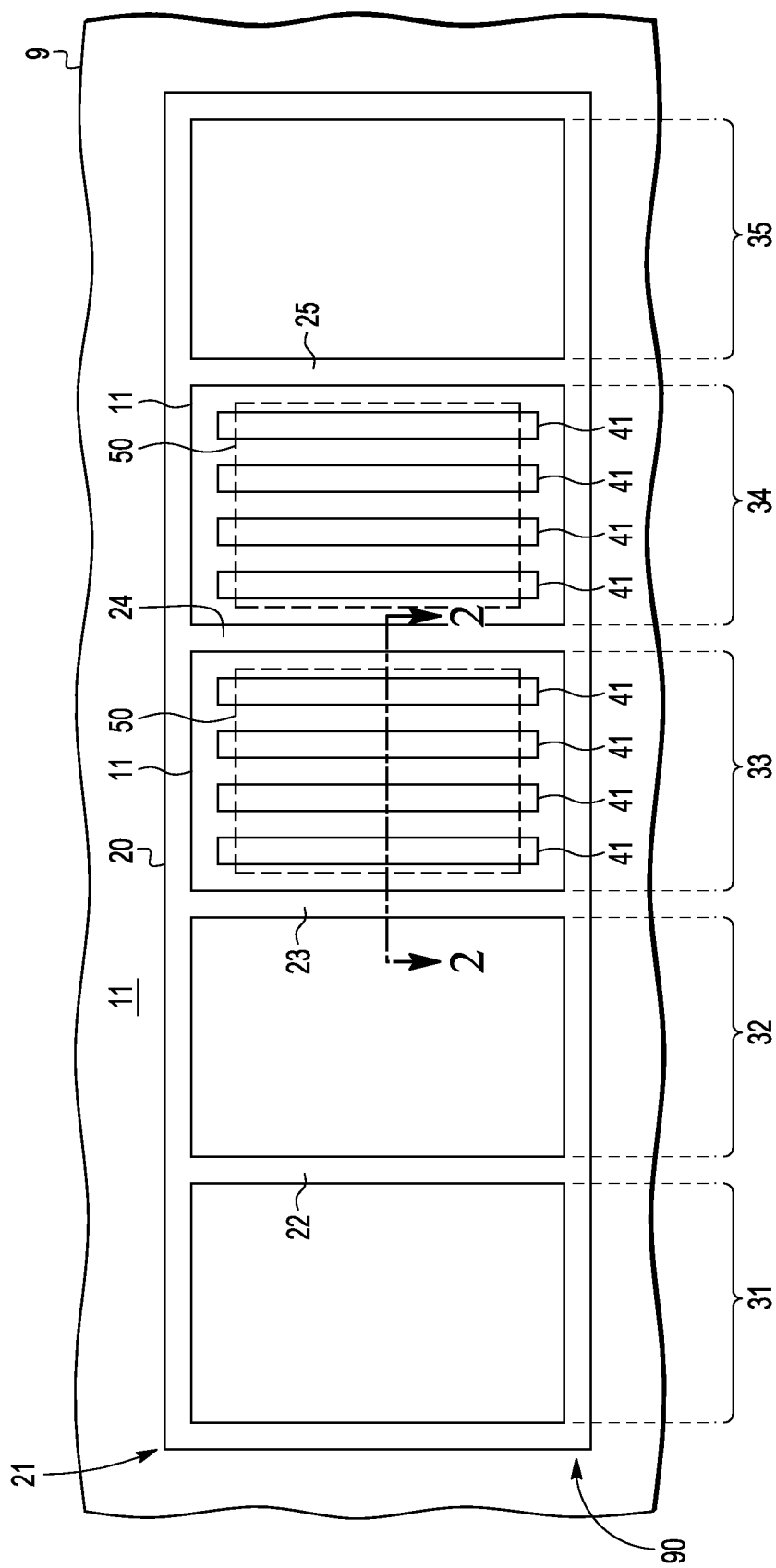
FIG. 1 is a top view of a layout of a known overstress protection circuit.
Figure 2:
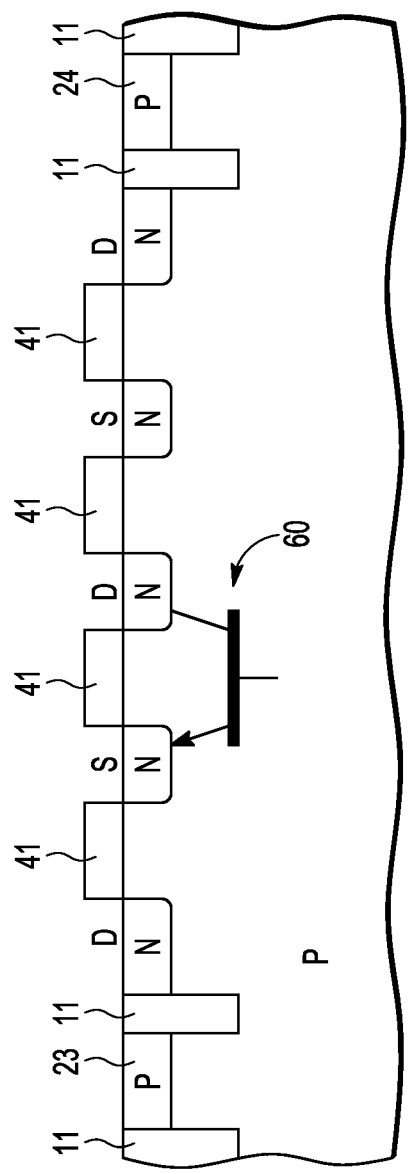
FIG. 2 is a cross-section view of the known overstress protection circuit of FIG. 1.

It will be appreciated that the disclosed overstress circuit provides a lower-resistance and unobstructed path between segments than other configurations. This path allows current to more readily flow from a segment experiencing snapback to an adjacent segment not yet in snapback through a well layer, because the current does not need to pass under a well-tie and its adjacent, relatively deep STI regions. As a result, a greater amount of current, as compared to the prior art embodiment of FIG. 1, is more readily introduced to segments adjacent to the initial snapback segment due to the difference in potential between the well of the segment initially experiencing snapback and the well of adjacent segments. This additional current facilitates raising the potential of the well region of the segment not in snapback, which helps forward biasing the base-emitter of the adjacent segment, thus promoting snapback. As additional segments experience snapback the reliability of the high-voltage protection circuit increases. It will be appreciated that the embodiments disclosed herein have less complexity and may be implemented in a smaller layout area than do embodiments that use feedback paths from segment locations that are used to actively bias the well near the well-tie region, such as feedback paths between source/drain and well regions.

Figure 8:
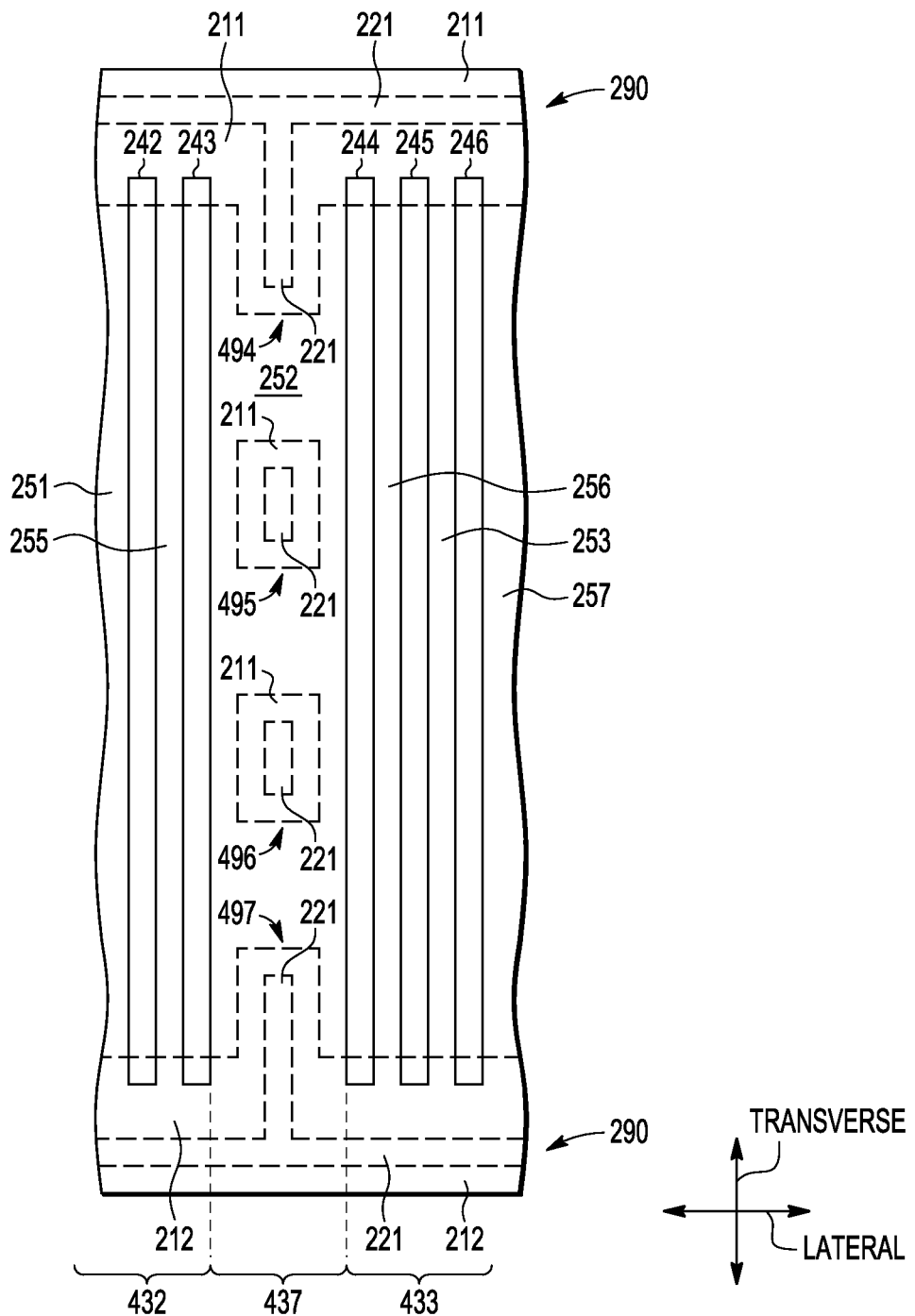
FIG. 8 is a cross section view of a well-tie region according to a particular embodiment and FIG. 9 is a cross section view of a well-tie region according to a particular embodiment.

It will be appreciated that other layout embodiments of the well-tie regions separating transistor segments from each other are envisioned. For example, FIG. 8 illustrates an overhead view of a portion of an overstress protection circuit that includes an embodiment of a well-tie region 437 between segments 432 and 433 including well-tie island structures 495, 496 and well-tie ring extension structures 494, 497. The term "well-tie ring extension" as used herein is intended to refer to a well-tie portion that is contiguous with a well-tie ring, and extends inward from the well-tie ring. Thus, well-tie ring extension structures 494, 497 include well-ties that extend inward from the well-tie ring 290 in the transverse direction. Thus, the well-tie island structures 495, 496 are between shared source/drain region 252 in a lateral direction and in a transverse direction by virtue of being surrounded by the shared source/drain region 252. The well-tie ring extensions 494, 497 are between the shared source/drain region 252 in a lateral direction, but not in a transverse direction.

Figure 9:
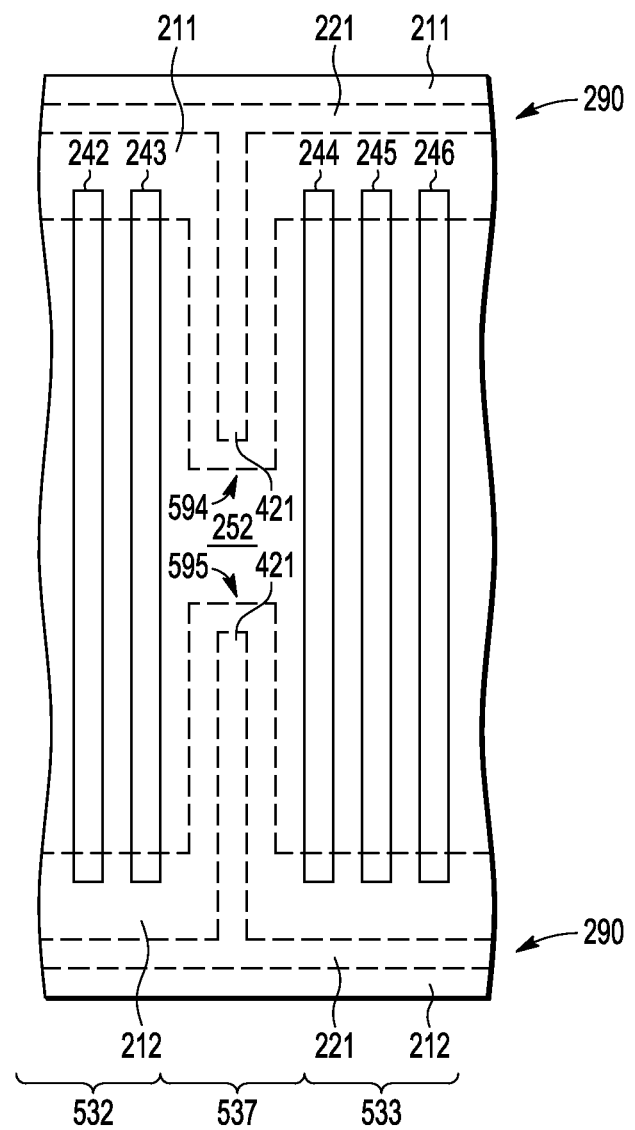

FIG. 9 illustrates an overhead view of a portion of an overstress protection circuit that includes an embodiment of a well-tie region 537 between segments 532 and 533 including well-tie ring extension structures 594, 595, but not well-tie islands. The well-tie extension structures 594, 595 extend inward from the well-tie ring 290 in the transverse direction. The well-tie ring extension structures 594, 595 are between the shared source/drain region 252 in a lateral direction, but not in a transverse direction. Because the well-tie extension structures 594, 595 do not connect within the well-tie region 537, a single low-resistance "bridge" is formed between the well-tie extension structures 594, 595 through which well current can more readily flow, as opposed to the well resistance of a current path underlying the well-tie extension structures 495 and 496. In the illustrated embodiment, the shared source/drain region 252 of FIG. 9 resides at the center location of the well-tie region 537 in a transverse direction. In other embodiments, the shared source/drain region 252 does not need to reside at the center location.

An integrated circuit device can include a Field Effect Transistor (FET) including a first transistor finger and a second transistor finger, wherein the first transistor finger and the second transistor finger share a first source/drain region of a first conductivity type residing in a well region having a second conductivity type, wherein the first conductivity type is opposite the second conductivity type. The integrated circuit device can also include a first well-tie between a first portion of the first source/drain region and a second portion of the first source/drain region, the first well-tie coupled to a voltage reference terminal that provides a fixed bias voltage for the well region during normal operation of the integrated circuit.

In one embodiment of the first aspect, the first well-tie is between the first and second portions of the first source/drain region in a lateral direction. In another embodiment of the first aspect, the first well-tie is between the first and second portions of the first source/drain region in a transverse direction. In a further embodiment of the first aspect, the first well-tie is surrounded by the first source/drain region.

In yet another embodiment of the first aspect, the device includes a second well-tie between the second portion of the first source/drain region and a third portion of the first source/drain region, wherein the first well-tie and a surrounding dielectric region are surrounded by the first source/drain region. In a particular embodiment, the second portion of the first source/drain region is at a center location of the first source/drain region in a transverse direction. In another particular embodiment, the first well-tie is at a center location of the first source/drain region in a transverse direction. In a further particular embodiment, a gate of the first transistor finger and a gate of the second transistor finger are coupled together. In yet another particular embodiment, a ratio of a first dimension to a second dimension is at least 1:1, wherein the first dimension is a shortest distance in a transverse direction between a dielectric of the first well-tie and a dielectric of the second well-tie, and the second dimension is a length of the first well-tie and its surrounding dielectric in the transverse direction. In a more particular embodiment, the ratio is at least 2:1.

In yet a further embodiment of the first aspect, a gate of the first transistor finger and a gate of the second transistor are coupled together. In still another embodiment, the first source/drain region is a source region that is coupled to the voltage reference terminal.

In a second aspect, a method can include providing a first current from a source/drain region of a first Field Effect Transistor (a first FET) to a first well region of the first FET in response to an overstress event, receiving a snapback portion of the first current at a second source/drain region of the first FET, and receiving, via a current path, a biasing portion of the first current at a second well region closer to a second FET than to the first FET, wherein the current path includes a third well region abutting a shared source/drain region that is shared by the first FET and the second FET, and that extends continuously from a gate of the first FET to a gate of the second FET.

In a third aspect, a device can include an integrated circuit electrical protection device including a Field Effect Transistor (FET) including a plurality of transistor fingers, including a first transistor finger and a second transistor finger, each of the plurality of transistor fingers including a gate portion, a source region, and a drain region shared with another one of the plurality of transistor fingers, wherein the first transistor finger shares a first drain region with the second transistor finger, and the source region is coupled to a fixed voltage reference terminal. The method can further include a first well-tie between a first portion of the first drain region and a second portion of the first drain region, the first well-tie coupled to the fixed voltage reference terminal that is to provide a fixed voltage during normal operation.

In one embodiment of the third aspect, the first well-tie is surrounded by the first drain region. In another embodiment, the device includes a second well-tie is between the second portion of the first drain region and a third portion of the first drain region. In a particular embodiment, the second portion of the first drain region is at a center location of the first drain region relative a width of the first drain region. In another particular embodiment, the first well-tie is at a center location of the first drain region in a transverse direction. In a further particular embodiment, ratio of a dimension between the first and second well-ties to a width of the first well-tie is at least 1:1, wherein the dimension and the width are relative to a width of the first drain region. In a more particular embodiment, the ratio is at least 2:1, wherein the dimension and the width are relative to a width of the first drain region.

In a further embodiment of the third aspect, the plurality of transistor fingers further include a third transistor finger and a fourth transistor finger, the third transistor finger shares a second drain region with the fourth transistor finger, and the FET transistor further includes a second well-tie between a first portion of the second drain region and a second portion of the second drain region, the second well-tie coupled to the fixed voltage reference terminal, and the second and third transistor fingers are members of a set of the plurality of transistor fingers, wherein no well-ties reside between gates of the members of the set. In a particular embodiment, the first well-tie is one of a first plurality of well-ties within the first drain region, the second well-tie is one of a second plurality of well-ties within the second drain region.

Although the invention is described herein with reference to specific embodiments, various modifications and changes can be made without departing from the scope of the present invention as set forth in the claims below. For example, the change in body potential is described as an increase but may, in the proper situation, be a decrease. For example, the conductivity types of the various doped regions may be able to be reversed to obtain analogous operation but using P type transistors and PNP inherent bipolar transistors. As another example, while the illustrated embodiments address a protection circuit that monitors a fixed terminal, VDD, for an overstress event, a similar circuit can be used to protect terminals that transmit data signals, such as analog or digital data signals. In addition, it will be appreciated that field effect transistors (FETs) other than metal oxide semiconductor field effect transistors (MOSFETs) described herein can be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit device comprising:
a Field Effect Transistor (FET) comprising a first transistor finger and a second transistor finger, wherein the first transistor finger and the second transistor finger share a first source/drain region of a first conductivity type residing in a well region having a second conductivity type, wherein the first conductivity type is opposite the second conductivity type; and
a first well-tie between a first portion of the first source/drain region and a second portion of the first source/drain region, the first well-tie coupled to a voltage reference terminal that provides a fixed bias voltage for the well region during normal operation of the integrated circuit.

2. The device of claim 1, wherein the first well-tie is between the first and second portions of the first source/drain region in a lateral direction.

3. The device of claim 1, wherein the first well-tie is between the first and second portions of the first source/drain region in a transverse direction.

4. The device of claim 1, wherein the first well-tie is surrounded by the first source/drain region.

5. The device of claim 1 further comprising:
a second well-tie between the second portion of the first source/drain region and a third portion of the first source/drain region, wherein the first well-tie and a surrounding dielectric region are surrounded by the first source/drain region.

6. The device of claim 5, wherein the second portion of the first source/drain region is at a center location of the first source/drain region in a transverse direction.

7. The device of claim 5, wherein the first well-tie is at a center location of the first source/drain region in a transverse direction.

8. The device of claim 5, wherein a gate of the first transistor finger and a gate of the second transistor finger are coupled together.

9. The device of claim 5, wherein a ratio of a first dimension to a second dimension is at least 1:1, wherein the first dimension is a shortest distance in a transverse direction between a dielectric of the first well-tie and a dielectric of the second well-tie, and the second dimension is a length of the first well-tie and its surrounding dielectric in the transverse direction.

10. The device of claim 1, wherein a gate of the first transistor finger and a gate of the second transistor are coupled together.

11. The device of claim 1, wherein the first source/drain region is a source region that is coupled to a second voltage reference terminal.

12. A method comprising:
providing a first current from a source/drain region of a first Field Effect Transistor (a first FET) to a first well region of the first FET in response to an overstress event;
receiving a snapback portion of the first current at a second source/drain region of the first FET; and
receiving, via a current path, a biasing portion of the first current at a second well region closer to a second FET than to the first FET, wherein the current path includes a third well region abutting a shared source/drain region that is shared by the first FET and the second FET, and that extends continuously from a gate of the first FET to a gate of the second FET.

13. A device comprising:
an integrated circuit electrical protection device comprising a Field Effect Transistor (FET) comprising a plurality of transistor fingers, including a first transistor finger and a second transistor finger, each of the plurality of transistor fingers comprising a gate portion, a source region, and a drain region shared with another one of the plurality of transistor fingers, wherein the first transistor finger shares a first drain region with the second transistor finger, and the source region is coupled to a fixed voltage reference terminal, and a first well-tie between a first portion of the first drain region and a second portion of the first drain region, the first well-tie coupled to the fixed voltage reference terminal that is to provide a fixed voltage during normal operation.

14. The device of claim 13 wherein the first well-tie is surrounded by the first drain region.

15. The device of claim 13 further comprising:
a second well-tie is between the second portion of the first drain region and a third portion of the first drain region.

16. The device of claim 15, wherein the second portion of the first drain region is at a center location of the first drain region relative a width of the first drain region.

17. The device of claim 15, wherein the first well-tie is at a center location of the first drain region in a transverse direction.

18. The device of claim 15, wherein ratio of a dimension between a dielectric surrounding the first well-tie and a dielectric surrounding the second well-tie to a width of the first well-tie is at least 1:1, wherein the dimension and the width are relative to a width of the first drain region.

19. The device of claim 13, wherein the plurality of transistor fingers further include a third transistor finger and a fourth transistor finger, the third transistor finger shares a second drain region with the fourth transistor finger; and the FET transistor further includes a second well-tie between a first portion of the second drain region and a second portion of the second drain region, the second well-tie coupled to the fixed voltage reference terminal, and the second and third transistor fingers are members of a set of the plurality of transistor fingers, wherein no well-ties reside between gates of the members of the set.

20. The device of claim 19, wherein the first well-tie is one of a first plurality of well-ties within the first drain region, the second well-tie is one of a second plurality of well-ties within the second drain region.

* * * * *